(12) United States Patent
Kim et al.

(10) Patent No.: US 12,308,257 B2
(45) Date of Patent: May 20, 2025

(54) WAFER TREATMENT APPARATUS AND METHOD FOR REDUCING SCATTERING OF TREATMENT LIQUID

(71) Applicant: SEMES CO., LTD., Cheonan-si (KR)

(72) Inventors: Young Jin Kim, Cheonan-si (KR); Eunhyeok Choi, Cheonan-si (KR); Ye Jin Choi, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 277 days.

(21) Appl. No.: 18/074,454

(22) Filed: Dec. 3, 2022

(65) Prior Publication Data

US 2023/0215743 A1  Jul. 6, 2023

(30) Foreign Application Priority Data

Dec. 31, 2021  (KR) .......................... 10-2021-0194303

(51) Int. Cl.
| | |
|---|---|
| *H01L 21/67* | (2006.01) |
| *B08B 3/02* | (2006.01) |
| *B08B 13/00* | (2006.01) |
| *H01L 21/687* | (2006.01) |

(52) U.S. Cl.
CPC ........ *H01L 21/67051* (2013.01); *B08B 3/022* (2013.01); *B08B 13/00* (2013.01); *H01L 21/68764* (2013.01)

(58) Field of Classification Search
CPC ......... H01L 21/67051; H01L 21/68764; H01L 21/6708; H01L 21/6715; H01L 21/67253; H01L 21/68728; H01L 21/67017; H01L 21/67023; H01L 21/6719; H01L 21/68714; H01L 21/02057; H01L 21/0209;

(Continued)

(56) References Cited

U.S. PATENT DOCUMENTS

| | | | | |
|---|---|---|---|---|
| 2006/0183240 | A1* | 8/2006 | Taniyama | ......... H01L 21/67748 257/E21.228 |
| 2012/0260946 | A1* | 10/2012 | Ogata | ............... H01L 21/67051 134/33 |

(Continued)

FOREIGN PATENT DOCUMENTS

| | | |
|---|---|---|
| KR | 10-1570168 | 11/2015 |
| KR | 10-1927919 | 12/2018 |

OTHER PUBLICATIONS

KR 10-2020-0028590 (Year: 2020).*

*Primary Examiner* — Alexander Markoff

(57) ABSTRACT

A wafer treatment apparatus includes a wafer supporter for supporting and rotating a wafer, a frontside liquid discharger for discharging a liquid toward a frontside of the wafer, a backside liquid discharger for discharging the liquid toward a backside of the wafer, a treatment chamber for accommodating the wafer supporter, and including liquid collecting inlets stacked on each other and receiving the liquid discharged from at least one of the frontside and backside liquid dischargers, and a controller for controlling a height of an upper end of a first liquid collecting inlet of the liquid collecting inlets to have one of a first height in a process of discharging the liquid to the backside of the wafer adjacent to the wafer supporter and a second height, lower than the first height, in a process of discharging the liquid to the frontside of the wafer.

19 Claims, 8 Drawing Sheets

(58) Field of Classification Search
CPC ......... H01L 21/67242; H01L 21/68742; H01L 21/6875; B08B 3/022; B08B 13/00; B08B 17/025
See application file for complete search history.

(56) References Cited

U.S. PATENT DOCUMENTS

| | | | |
|---|---|---|---|
| 2014/0014134 A1* | 1/2014 | Ogata | .................... B08B 13/00 |
| | | | 134/104.1 |
| 2014/0182631 A1* | 7/2014 | Namba | ............. H01L 21/67051 |
| | | | 15/268 |
| 2014/0261163 A1* | 9/2014 | Kishita | ............. H01L 21/68714 |
| | | | 118/52 |
| 2015/0380279 A1* | 12/2015 | Kwon | ............... H01L 21/67051 |
| | | | 134/104.2 |
| 2016/0013079 A1* | 1/2016 | Choi | ................. H01L 21/67051 |
| | | | 156/345.21 |
| 2017/0271177 A1* | 9/2017 | Kikumoto | ................. B08B 3/08 |
| 2017/0361364 A1* | 12/2017 | Ogata | .................... B08B 13/00 |
| 2020/0144054 A1* | 5/2020 | Oh | .................... H01L 21/67017 |
| 2022/0102169 A1* | 3/2022 | Kim | ................. H01L 21/02052 |

* cited by examiner

WAFER TREATMENT APPARATUS AND METHOD FOR REDUCING SCATTERING OF TREATMENT LIQUID

CROSS-REFERENCE TO RELATED PATENT APPLICATION

This application claims the benefit of Korean Patent Application No. 10-2021-0194303, filed on Dec. 31, 2021, in the Korean Intellectual Property Office, the disclosure of which is incorporated by reference herein in its entirety.

BACKGROUND OF THE INVENTION

1. Field of the Invention

The present disclosure relates to a semiconductor apparatus and, more particularly, to a wafer treatment apparatus and a method for reducing scattering of treatment liquid.

2. Description of the Related Art

Various processes such as photolithography, etching, ashing, ion injection, deposition, and cleaning are performed on a wafer to manufacture semiconductor devices, and various wafer treatment apparatuses are used for such processes. Circuit patterns are getting finer and denser due to the increase in performance of semiconductor devices, and contaminants such as fine particles, organic substances, and metals remaining on the wafer surface may exert a significant effect on the characteristics and production yield of semiconductor devices. As such, a cleaning process for removing various process substances and contaminants from the wafer surface is unavoidable, and may be performed on the wafer in every unit process of a semiconductor manufacturing procedure.

In the wafer cleaning process, chemical treatment, rinsing, and drying may be sequentially performed. Metals, organic substances, particles, etc. remaining on the wafer are removed in the chemical treatment operation, chemicals remaining on the wafer are removed using a rinsing liquid such as deionized (DI) water in the rinsing operation, and the wafer is dried using a nitrogen gas, an organic solvent such as isopropyl alcohol (IPA), or the like in the drying operation.

Most of treatment liquids supplied into a wafer treatment apparatus during the cleaning process may be collected and reused, but some substances not collected but scattered may be attached to and remain in a chamber. Such foreign substances may move to another wafer or apparatus in a subsequent wafer treatment process and thus process errors may be caused. Therefore, a technology for reducing scattering of treatment liquids is required.

SUMMARY OF THE PRESENT DISCLOSURE

The present disclosure provides a wafer treatment apparatus and scattering reduction method capable of reducing scattering of wafer treatment liquids.

The present disclosure also provides a wafer treatment apparatus and scattering reduction method capable of preventing internal contamination of the wafer treatment apparatus and reducing process errors by reducing scattering of the wafer treatment liquids.

The present disclosure also provides a wafer treatment apparatus and scattering reduction method capable of providing an optimal process environment for reducing scattering in a process of cleaning a frontside/backside of a wafer.

However, the scope of the present disclosure is not limited thereto.

According to an aspect of the present disclosure, a wafer treatment apparatus includes a wafer supporter for supporting and rotating a wafer, a frontside liquid discharger for discharging a liquid toward a frontside of the wafer, a backside liquid discharger for discharging the liquid toward a backside of the wafer, a treatment chamber for accommodating the wafer supporter, and including a plurality of liquid collecting inlets stacked on each other in a vertical direction and receiving the liquid discharged from at least one of the frontside and backside liquid dischargers, and a controller for controlling a height, relative to the frontside of the wafer, of an upper end of a first liquid collecting inlet of the plurality of liquid collecting inlets to have one of a first height in a process of discharging the liquid to the backside of the wafer adjacent to the wafer supporter and a second height, lower than the first height, in a process of discharging the liquid to the frontside of the wafer.

According to an aspect of the present disclosure, there is provided a method for reducing scattering of a treatment liquid in a wafer treatment apparatus including a wafer supporter for supporting a wafer and provided to be rotatable, a liquid discharger for discharging a liquid for treatment to a frontside and a backside of the wafer, and a treatment chamber for providing at least one inflow space surrounding the wafer supporter and formed in a vertical direction to receive the liquid, the method including controlling a height from the wafer to an upper end of the inflow space to be higher in a process of discharging the liquid to the backside of the wafer, compared to a process of discharging the liquid to the frontside of the wafer.

According to an aspect of the present disclosure, there is provided a wafer treatment apparatus for reducing scattering of a liquid in a process of discharging the liquid to a backside of a wafer, the wafer treatment apparatus including a wafer supporter for supporting a wafer and provided to be rotatable, a liquid discharger for discharging a liquid for treatment to a frontside and a backside of the wafer, a treatment chamber for providing at least one inflow space surrounding the wafer supporter and formed in a vertical direction to receive the liquid, and a controller for controlling a height from the wafer to an upper end of the inflow space to be higher in a process of discharging the liquid to the backside of the wafer facing the wafer supporter, compared to a process of discharging the liquid to the frontside of the wafer, wherein the treatment chamber includes a plurality of collection barrels disposed along a vertical direction and each including a side wall and an upper wall extending inward and diagonally upward from an upper end of the side wall, and wherein the controller controls a maximum lifting height in such a manner that a height of a horizontal plane of the wafer supported by the wafer supporter is not lower than an upper end of a side wall of a collection barrel provided at a higher position from among two collection barrels forming the inflow space.

BRIEF DESCRIPTION OF THE DRAWINGS

The above and other features and advantages of the present disclosure will become more apparent by describing in detail embodiments thereof with reference to the attached drawings in which.

DETAILED DESCRIPTION OF THE INVENTION

Figure 1:
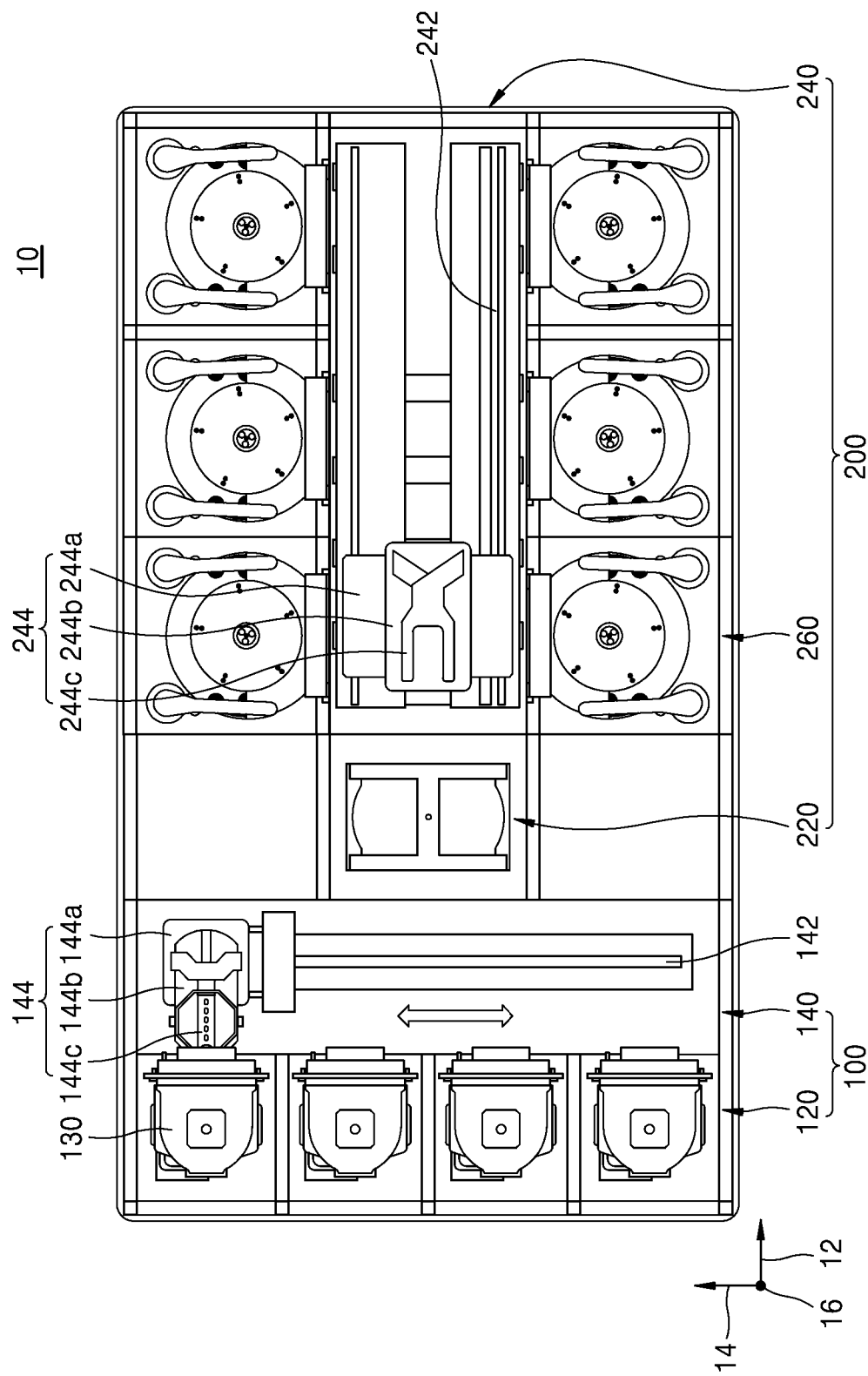
FIG. 1 is a plan view of a wafer treatment system according to an embodiment of the present disclosure.

Hereinafter, the present disclosure will be described in detail by explaining embodiments of the present disclosure with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

Embodiments of the present disclosure are described herein with reference to schematic illustrations of idealized embodiments (and intermediate structures) of the present disclosure. As such, variations from the shapes of the illustrations as a result, for example, of manufacturing techniques and/or tolerances, are to be expected. Thus, the embodiments of the present disclosure should not be construed as limited to the particular shapes of regions illustrated herein, but are to include deviations in shapes that result, for example, from manufacturing.

FIG. 1 is a plan view of a wafer treatment system 10 according to an embodiment of the present disclosure.

Referring to FIG. 1, the wafer treatment system 10 includes an index module 100 and a treatment module 200. The index module 100 includes load ports 120 and a transport frame 140. The load ports 120, the transport frame 140, and the treatment module 200 may be sequentially arranged. In this specification, a direction in which the load ports 120, the transport frame 140, and the treatment module 200 are arranged is referred to as a first direction 12 (or an x-axis direction), a direction perpendicular to the first direction 12 when viewed from above is referred to as a second direction 14 (or an y-axis direction), and a direction perpendicular to a plane including the first and second directions 12 and 14 (i.e., an xy plane) is referred to as a third direction 16 (or a z-axis direction).

Carriers 130 containing wafers W are seated on the load ports 120. A plurality of load ports 120 may be disposed along the second direction 14. The number of load ports 120 may increase or decrease depending on process efficiency, production efficiency, or the like of the treatment module 200. Each carrier 130 may use a front opening unified pod (FOUP) and include slots for holding a plurality of wafers W horizontally.

The treatment module 200 includes a buffer unit 220, a transport chamber 240, and process chambers 260. The transport chamber 240 may extend in parallel with the first direction 12, and the process chambers 260 may be disposed at both sides in a lengthwise direction of the transport chamber 240. Some of the process chambers 260 may be stacked on one another. Meanwhile, the process chambers 260 may be disposed only at one side of the transport chamber 240.

The buffer unit 220 is disposed between the transport frame 140 and the transport chamber 240 to provide a space where the wafer W stays before being transported between the transport frame 140 and the transport chamber 240. The buffer unit 220 includes a slot where the wafer W is disposed. The buffer unit 220 may be provided to be open or closed with respect to the transport frame 140 and the transport chamber 240.

The transport frame 140 may transport the wafers W between the carriers 130 and the buffer unit 220. The transport frame 140 is provided with index rails 142 and an index robot 144. The index rails 142 may extend in parallel with the second direction 14, and the index robot 144 may be mounted thereon to move along the second direction 14. The index robot 144 includes a base 144a, a body 144b, and an index arm 144c. The base 144a is provided to be movable along the index rails 142. The body 144b is coupled to the base 144a, and is provided to be rotatable and movable along the third direction 16 on the base 144a. The index arm 144c is coupled to the body 144b, and is provided to be movable away from or toward the body 144b. A plurality of index arms 144c may be provided and individually driven. Each index arm 144c may be used to transport the wafers W from the carriers 130 to the treatment module 200, or from the treatment module 200 to the carriers 130.

The transport chamber 240 transports the wafers W between the buffer unit 220 and the process chambers 260, or between the process chambers 260. The transport chamber 240 is provided with guide rails 242 and a main robot 244. The guide rails 242 may extend in parallel with the first direction 12, and the main robot 244 may be mounted thereon to move along the first direction 12. The main robot 244 includes a base 244a, a body 244b, and a main arm 244c. The base 244a is provided to be movable along the guide rails 242. The body 244b is coupled to the base 244a, and is provided to be rotatable and movable along the third direction 16 on the base 244a. The main arm 244c is coupled to the body 244b, and is provided to be movable away from or toward the body 244b. A plurality of main arms 244c may be provided and individually driven.

The process chambers 260 are provided with wafer treatment apparatuses 300 (see FIG. 2) for performing processes on the wafers W. The wafer treatment apparatuses 300 may have different structures depending on processes to be performed. Meanwhile, the wafer treatment apparatuses 300 in the process chambers 260 may have the same structure, or the wafer treatment apparatuses 300 in the process chambers 260 belonging to the same group may have the same structure.

The wafer treatment apparatuses 300 perform liquid treatment on the wafers W. Although the liquid treatment process performed on the wafers W is assumed as a cleaning process in this specification, the liquid treatment process is not limited thereto and the present disclosure is also applicable to an etching process, a photolithography process, etc.

Figure 2:
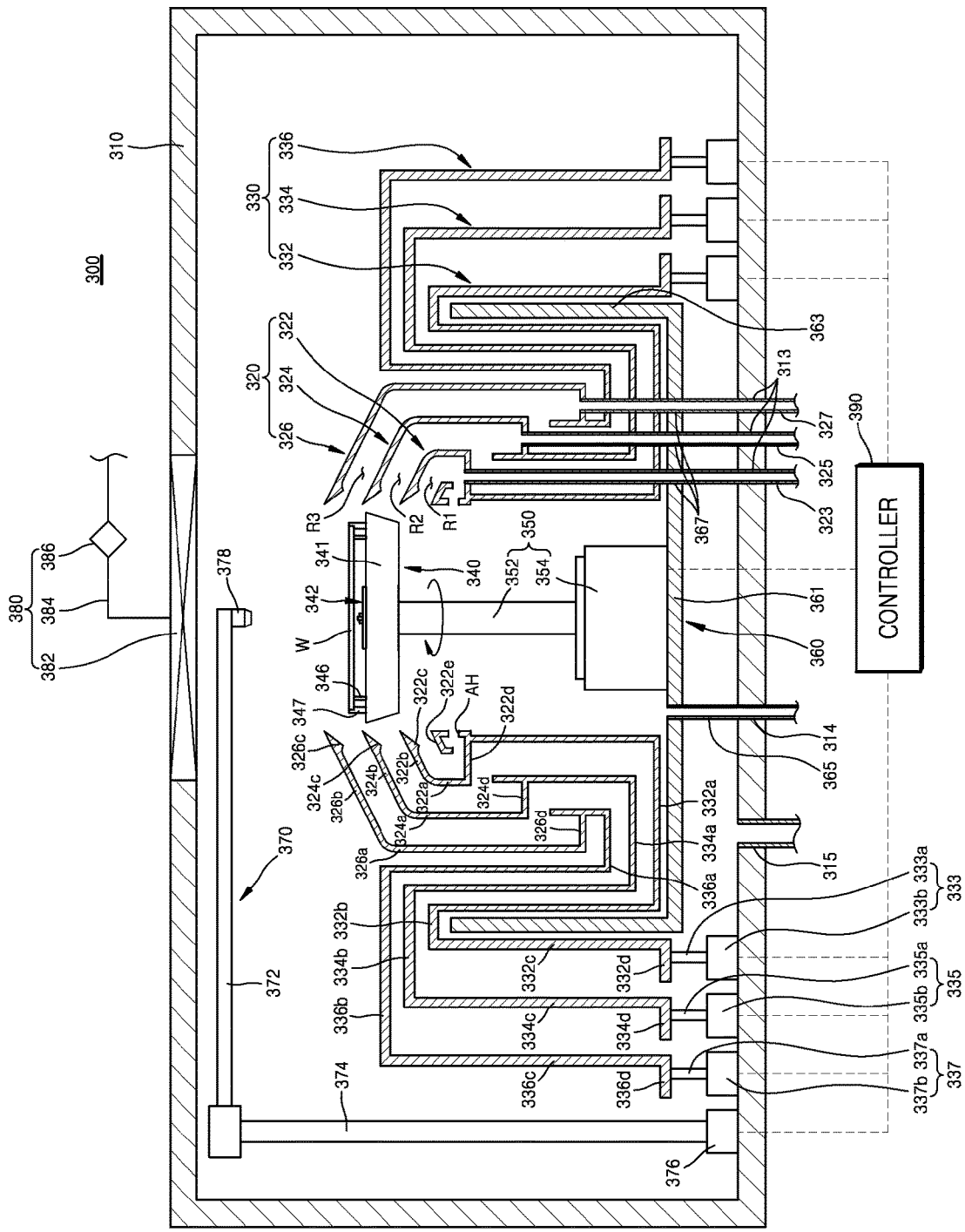
FIG. 2 is a cross-sectional view of a wafer treatment apparatus according to an embodiment of the present disclosure.

FIG. 2 is a cross-sectional view of a wafer treatment apparatus 300 according to an embodiment of the present disclosure.

Referring to FIG. 2, the wafer treatment apparatus 300 includes a housing 310, a treatment chamber 320, lifts 330 (i.e., lift bars), a wafer supporter 340, a support driver 350, a base 360, a liquid discharger 370, an air current supplier 380, and a controller 390.

The housing 310 provides an internal space. An opening (not shown) may be provided at a side of the housing 310 so as to be used as a passage for the wafer W. A door (not shown) may be mounted on the opening to open or close the opening. In a wafer treatment process, the opening is closed to seal the internal space of the housing 310. Vent pipes 313, 314, and 315 may be provided at a side of the housing 310 to expel an air current formed in the housing 310. An air current formed inside the treatment chamber 320 and the base 360 may be expelled through the vent pipes 313 and 314, and an air current formed outside may be expelled through the vent pipe 315.

The treatment chamber 320 provides a space where the wafer treatment process is performed. The treatment chamber 320 has an open top. The treatment chamber 320 includes a plurality of collection barrels 322, 324, and 326. Although three, e.g., first, second, and third, collection barrels 322, 324, and 326 are assumed in in an embodiment of the present disclosure, the number of collection barrels may increase or decrease. The collection barrels 322, 324, and 326 are spaced apart from each other along a vertical direction (or the third direction 16). The collection barrels 322, 324, and 326 may be vertically stacked on one another. The first, second, and third collection barrels 322, 324, and 326 may collect different treatment liquids used in the process. The treatment chamber 320 provides one or more inflow spaces R1, R2, and R3 (i.e., one or more liquid collecting inlets) formed in a vertical direction (or the third direction 16) to receive the treatment liquids after the wafer treatment.

The first collection barrel 322 may be disposed to surround the wafer supporter 340, the second collection barrel 324 may be disposed to surround the first collection barrel 322, and the third collection barrel 326 may be disposed to surround the second collection barrel 324. The collection barrels 322, 324, and 326 are provided in circular ring shapes. An internal space R1 of the first collection barrel 322, a space R2 between the first and second collection barrels 322 and 324, and a space R3 between the second and third collection barrels 324 and 326 function as the inflow spaces R1, R2, and R3 into which the treatment liquids are introduced. Collection pipes 323, 325, and 327 may extend downward from bottom surfaces 322d, 324d, and 326d of the collection barrels 322, 324, and 326 to expel the treatment liquids introduced into the inflow spaces R1, R2, and R3, respectively. The collection pipes 323, 325, and 327 extend to the outside through the vent pipes 313 of the housing 310 and vent pipes 367 of the base 360. The expelled treatment liquids may be reused through an external treatment liquid reuse system (not shown).

The collection barrels 322, 324, and 326 include side walls 322a, 324a, and 326a, upper walls 322b, 324b, and 326b, protrusions 322c, 324c, and 326c, and the bottom surfaces 322d, 324d, and 326d, respectively. The side walls 322a, 324a, and 326a are provided in circular ring shapes. The upper walls 322b, 324b, and 326b are provided in ring shapes extending inward and diagonally upward from upper ends of the side walls 322a, 324a, and 326a. The protrusions 322c, 324c, and 326c are provided in ring shapes extending downward from upper ends of the upper walls 322b, 324b, and 326b. The bottom surfaces 322d, 324d, and 326d extend inward from lower ends of the side walls 322a, 324a, and 326a. The first collection barrel 322 further includes a guide wall 322e spaced apart from the upper wall 322b in a downward direction and extending upward and outward from the bottom surface 322d, to form the internal space R1. Holes AH are formed in the guide wall 322e to provide paths for expelling the air current introduced into the internal space R1 through the vent pipe 314.

The lifts 330 are coupled to the collection barrels 322, 324, and 326 to lift the collection barrels 322, 324, and 326. The first lift 332 is connected to the first collection barrel 322, the second lift 334 is connected to the second collection barrel 324, and the third lift 336 is connected to the third collection barrel 326.

The first lift 332 includes a first lift base 332a, 332b, 332c, and 332d, and a first driving unit 333. The first lift base includes a collection barrel supporter 332a, a driving connector 332b, a vertical connector 332c, and a flange 332d. The collection barrel supporter 332a extends from below the first collection barrel 322 in parallel with a wall 363 of the base 360 to have an almost U-shaped cross-section. The driving connector 332b may horizontally extend outward from an end of the collection barrel supporter 332a, and be supported on the wall 363 of the base 360. The vertical connector 332c may have an upper end connected to the driving connector 332b and a lower end connected to the flange 332d, to receive a driving force for vertical motion from the first driving unit 333. The first driving unit 333 includes a driving shaft 333a and a driver 333b. The driving shaft 333a receives a driving force for vertical motion generated from the driver 333b, and is moved or stretched in a vertical direction to transmit the driving force for vertical motion to the flange 332d.

The second lift 334 includes a second lift base 334a, 334b, 334c, and 334d, and a second driving unit 335. The second lift base includes a collection barrel supporter 334a, a driving connector 334b, a vertical connector 334c, and a flange 334d. The collection barrel supporter 334a extends from below the second collection barrel 324 in parallel with the wall 363 of the base 360 to have an almost U-shaped cross-section. The driving connector 334b may horizontally extend outward from an end of the collection barrel supporter 334a, and be supported on the driving connector 332b of the first lift 332. The vertical connector 334c may have an upper end connected to the driving connector 334b and a lower end connected to the flange 334d, to receive a driving force for vertical motion from the second driving unit 335. The second driving unit 335 includes a driving shaft 335a and a driver 335b. The driving shaft 335a receives a driving force for vertical motion generated from the driver 335b, and is moved or stretched in a vertical direction to transmit the driving force for vertical motion to the flange 334d.

The third lift 336 includes a third lift base 336a, 336b, 336c, and 336d, and a third driving unit 337. The third lift base includes a collection barrel supporter 336a, a driving connector 336b, a vertical connector 336c, and a flange 336d. The collection barrel supporter 336a extends from below the third collection barrel 326 in parallel with the wall 363 of the base 360 to have an almost U-shaped cross-section. The driving connector 336b may horizontally extend outward from an end of the collection barrel supporter 336a, and be supported on the driving connector 334b of the second lift 334. The vertical connector 336c may have an upper end connected to the driving connector 336b and a lower end connected to the flange 336d, to receive a driving force for vertical motion from the third driving unit 337. The third driving unit 337 includes a driving shaft 337a and a driver 337b. The driving shaft 337a receives a driving force for vertical motion generated from the driver 337b, and is moved or stretched in a vertical direction to transmit the driving force for vertical motion to the flange 336d.

Figure 3:
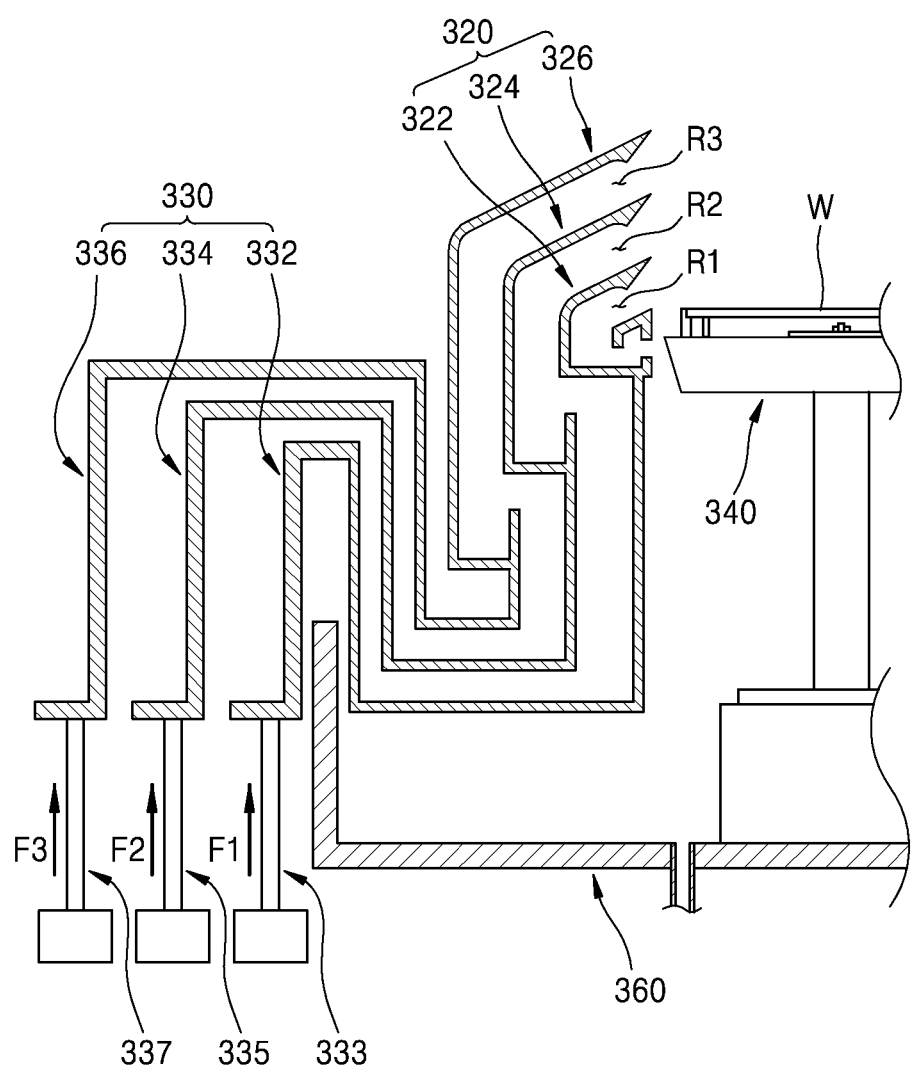
FIGS. 3 and 4 are cross-sectional views showing an operation of lifting a treatment chamber, according to embodiments of the present disclosure.
Figure 4:
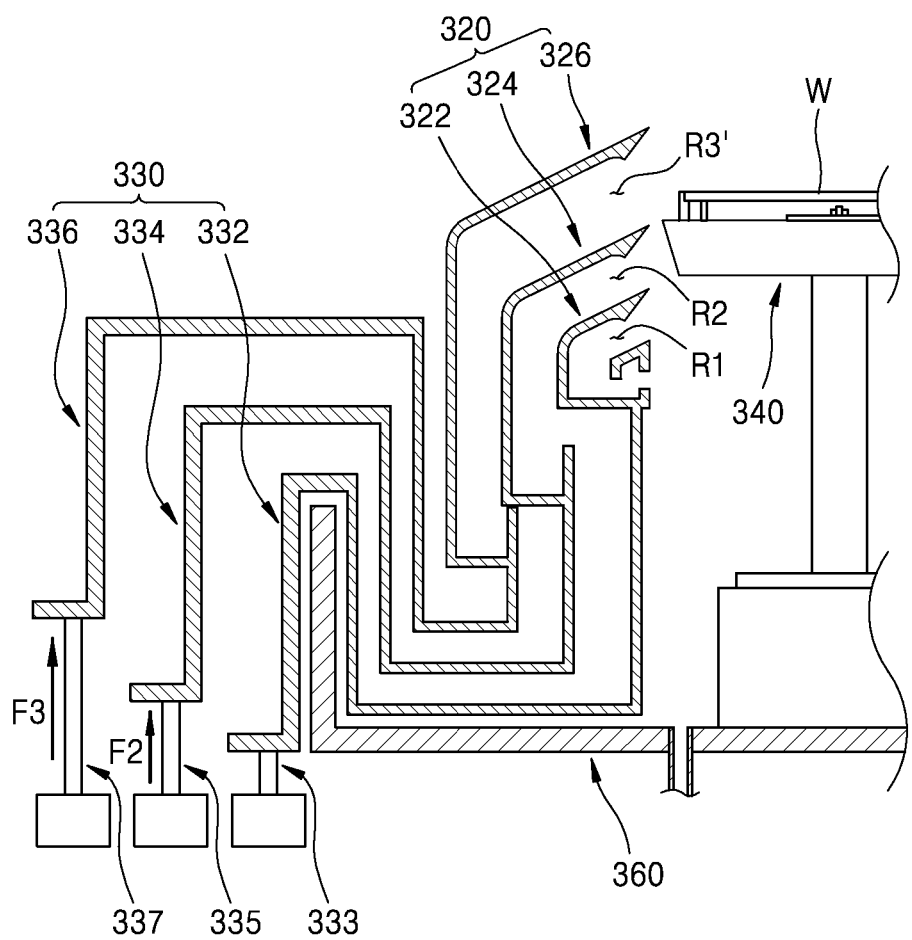

FIGS. 3 and 4 are cross-sectional views showing an operation of lifting the treatment chamber 320, according to embodiments of the present disclosure.

Referring to FIG. 3, the treatment chamber 320 according to an embodiment may be controlled in height in such a manner that the inflow space R1 may collect a treatment liquid. For example, in order to collect a chemical treatment liquid, the inflow space R1 may be controlled to correspond to a height of the wafer W. When the first driving unit 333 of the first lift 332 is driven, an upper end of the driving shaft 333a is raised. The driving shaft 333a transmits a driving force F1 for upward motion to the first lift base 332a, 332b, 332c, and 332d. The first collection barrel 322 connected to the first lift base 332a, 332b, 332c, and 332d is raised by a height corresponding to the driving force F1, to correspond the inflow space R1 to the height of the wafer W.

Because the second and third collection barrels 324 and 326 are stacked on the first collection barrel 322, the second and third collection barrels 324 and 326 may be raised together with the first collection barrel 322 without receiving driving forces F2 and F3 from the second and third lifts 334 and 336. Alternatively, the second and third collection barrels 324 and 326 may be raised by transmitting only certain driving forces F2 and F3 less than the driving force F1, to the second and third lift bases 334a, 334b, 334c, and 334d, and 336a, 336b, 336c, and 336d.

Meanwhile, unlike the illustration of FIG. 2, the second driving unit 335 may be disposed on the flange 332d of the first lift 332, and the third driving unit 337 may be disposed on the flange 334d of the second lift 334. In this case, as the upper end of the driving shaft 333a of the first lift 332 is raised, the flange 332d may be raised and the second lift 334 may also be raised. At the same time, the third lift 336 disposed on the flange 334d of the second lift 334 may also be raised. That is, when a lift at a lower position is driven, a lift at an upper position may be raised together and, when a collection barrel at a lower position is raised, a collection barrel at an upper position may also be raised.

Referring to FIG. 4, the treatment chamber 320 according to an embodiment may be controlled in height in such a manner that an inflow space R3' may collect a treatment liquid. For example, in order to collect deionized (DI) water used as a treatment liquid, the inflow space R3' may be controlled to correspond to a height of the wafer W. Because the inflow space R3' is provided as a space between the second and third collection barrels 324 and 326, the second and third lifts 334 and 336 may be driven to form the inflow space R3'. In particular, the inflow space R3' may be provided as a larger space in consideration of an amount of the treatment liquid, a discharge speed, a wafer rotation speed, or the like. To provide the inflow space R3' larger than the inflow space R3 of FIG. 3, the third collection barrel 326 may be raised to a higher position. When a distance by which the second collection barrel 324 is raised is greater than a distance by which the third collection barrel 326 is raised, the height of the inflow space R3' is increased by a difference in distance.

Because the second collection barrel 324 defines a lower limit of the inflow space R3', an upper end of the upper wall 324b of the second collection barrel 324 may be controlled to correspond to a height of the wafer supporter 340. The second lift 334 transmits a certain driving force F2 to adjust the height of the second collection barrel 324. Because the third collection barrel 326 defines an upper limit of the inflow space R3', a height of an upper end of the upper wall 326b of the third collection barrel 326 is adjusted to be higher to provide a larger inflow space R3'. The third lift 336 transmits a driving force F3 greater than the driving force F3 of FIG. 3 to adjust the height of the third collection barrel 326.

As described above, the lifts 330 may individually adjust heights of the collection barrels 322, 324, and 326. Therefore, depending on a process, a position of the inflow space R1, R2, or R3 corresponding to the wafer W may be changed, and a size of the inflow space R1, R2, or R3 may also be changed.

Figure 5:
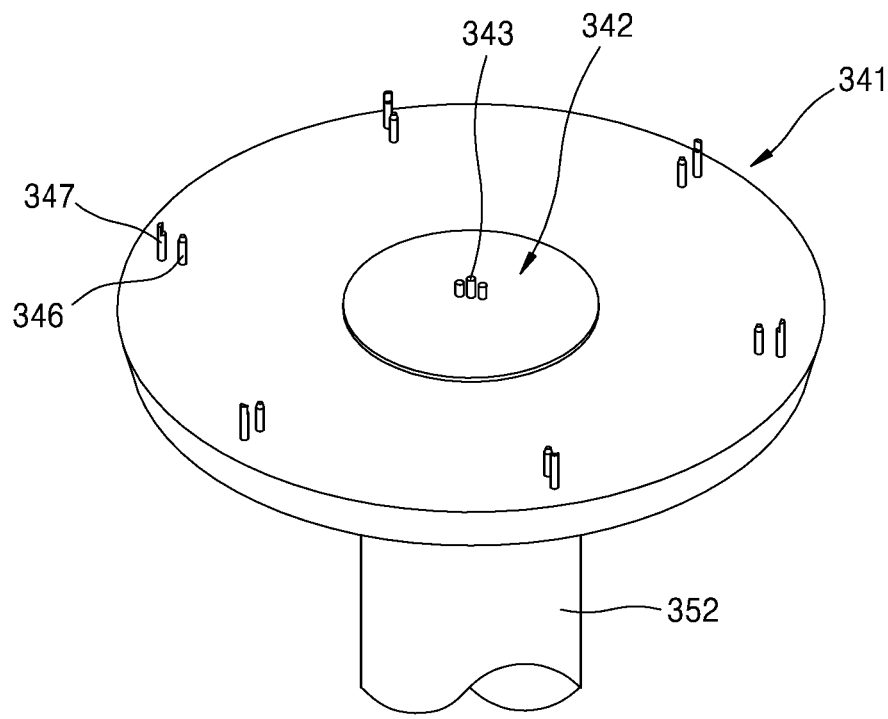
FIG. 5 is a perspective view of a wafer supporter.
Figure 6:
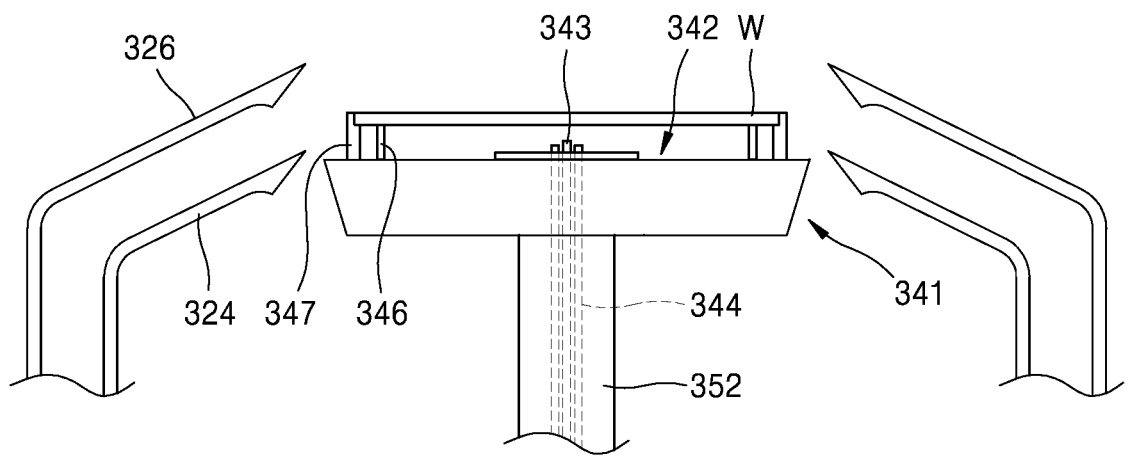
FIG. 6 is a cross-sectional view of the wafer supporter of FIG. 5.

FIG. 5 is a perspective view of the wafer supporter 340. FIG. 6 is a cross-sectional view of the wafer supporter 340 of FIG. 5.

Referring to FIGS. 5 and 6, the wafer supporter 340 supports and rotates the wafer W in an internal space of the housing 310. The wafer supporter 340 is disposed in an internal space of the treatment chamber 320. The wafer supporter 340 includes a rotating support plate 341 and a fixed support plate 342.

The rotating support plate 341 has an almost circular upper edge when viewed from above. The rotating support plate 341 is positioned in an outer region of the fixed support plate 342. The rotating support plate 341 is rotated by the support driver 350. Support pins 346 and chuck pins 347 are provided on the rotating support plate 341.

A plurality of support pins 346 are provided and spaced apart from each other at certain intervals on an edge region of an upper surface of the rotating support plate 341. The support pins 346 protrude upward from the upper surface of the rotating support plate 341 to support a backside of the wafer W. The wafer W is supported by the support pins 346 so as to be spaced apart from the upper surface of the rotating support plate 341, and a space where a treatment liquid is sprayed onto the exposed backside of the wafer W is provide.

A plurality of chuck pins 347 are provided and disposed outside the support pins 346 from a central axis of the rotating support plate 341. The chuck pins 347 protrude upward from the upper surface of the rotating support plate 341. The chuck pins 347 support an edge of the wafer W to prevent lateral dislocation of the wafer W from its position when the rotating support plate 341 is rotated. The chuck pins 347 are provided to be movable between standby positions and support positions along a radius direction of the rotating support plate 341. When the wafer W is loaded/unloaded onto/from the wafer supporter 340, the chuck pins 347 are positioned at the standby positions outside the support positions. When a process is performed on the wafer W, the chuck pins 347 are positioned at the support positions.

The fixed support plate 342 has an almost circular upper edge when viewed from above. The fixed support plate 342 is positioned in a central region of the wafer supporter 340.

A liquid discharger 343 (or a backside liquid discharger 343) is mounted on the fixed support plate 342.

The liquid discharger 343 (or the backside liquid discharger 343) supplies a treatment liquid to the backside of the wafer W. For example, a cleaning liquid such as DI water may be discharged from the liquid discharger 343 to clean the backside of the wafer W. A nozzle of the liquid discharger 343 is provided to penetrate through the fixed support plate 342. A plurality of nozzles may be provided. Backside liquid supply tubes 344 may pass through the support driver 350 from below the wafer supporter 340 and be connected to the liquid discharger 343. The treatment liquid from an external backside liquid supply system (not shown) may pass through the backside liquid supply tubes 344 and be discharged from the liquid discharger 343.

The support driver 350 may rotate or lift the wafer supporter 340. The support driver 350 is connected to the rotating support plate 341 of the wafer supporter 340. The support driver 350 includes a driving shaft 352 and a driver 354. The driving shaft 352 is rotated by the driver 354 to rotate the rotating support plate 341. In addition, the driving shaft 352 may be moved or stretched in a vertical direction by the driver 354 to adjust a height of the wafer supporter 340.

Referring back to FIG. 2, the base 360 is provided in a cylindrical shape surrounding the treatment chamber 320 and having an open top. The base 360 includes a bottom 361 and the wall 363. The base 360 is provided in a cup shape. The bottom 361 is provided in a disk shape and may be connected to a vent pipe 365. The wall 363 extends in a perpendicular direction from an edge of the bottom 361. The base 360 may be made of a resin material having a high acid resistance. The base 360 substantially functions as an outer wall of the entirety of the treatment chamber 320. The vent pipes 365 and 367 through which air currents are expelled are provided in the bottom 361.

The liquid discharger 370 (or a frontside liquid discharger 370) supplies a treatment liquid to the wafer W in a wafer treatment process. The liquid discharger 370 supplies the treatment liquid to a frontside of the wafer W. For example, an organic solvent such as isopropyl alcohol (IPA) may be discharged from the liquid discharger 370 to dry the frontside of the wafer W. The liquid discharger 370 includes a nozzle support bar 372, a nozzle support shaft 374, a nozzle driving member 376, and a nozzle 378. The nozzle support shaft 374 extends along the third direction 16, and the nozzle driving member 376 is coupled to a lower end of the nozzle support shaft 374. The nozzle driving member 376 rotates and lifts the nozzle support shaft 374. The nozzle support bar 372 is connected to an upper end of the nozzle support shaft 374. The nozzle 378 is mounted on an end of the nozzle support bar 372. The nozzle 378 is moved to a process position and a standby position due to the driving by the nozzle driving member 376. The process position is a position at which the nozzle 378 is above the wafer W, and the standby position is a position at which the nozzle 378 is dislocated from above the treatment chamber 320. The nozzle 378 may supply the treatment liquid to the frontside of the wafer W. A plurality of nozzles 378 may be provided.

The air current supplier 380 forms a descending air current in the internal space of the housing 310. The air current supplier 380 includes a fan 382, an air current supply line 384, and a filter 386. The fan 382 is mounted at an upper side of the housing 310 to form a descending air current in the internal space of the housing 310. The air current supply line 384 supplies external air into the housing 310. The filter 386 filters impurities included in the air.

The controller 390 controls the lifts 330, the liquid discharger 343 (or the backside liquid discharger 343), the support driver 350, and the liquid discharger 370 (or the frontside liquid discharger 370). Specific control operations of the controller 390 will be described below.

According to an embodiment, a treatment liquid may be supplied (1) only to the frontside, (2) only to the backside, or (3) to both the frontside and backside of the wafer W. When a dry process is performed using an organic solvent such as IPA, the treatment liquid is supplied only to the frontside of the wafer W. In addition, When the treatment liquid is supplied to the frontside of the wafer W, because the treatment liquid may remain at an edge of the wafer W, the treatment liquid is also applied to the backside to prevent contamination of the wafer W. Alternatively, when cleaning is performed using DI water, the treatment liquid may be supplied only to the backside of the wafer W.

Figure 7:
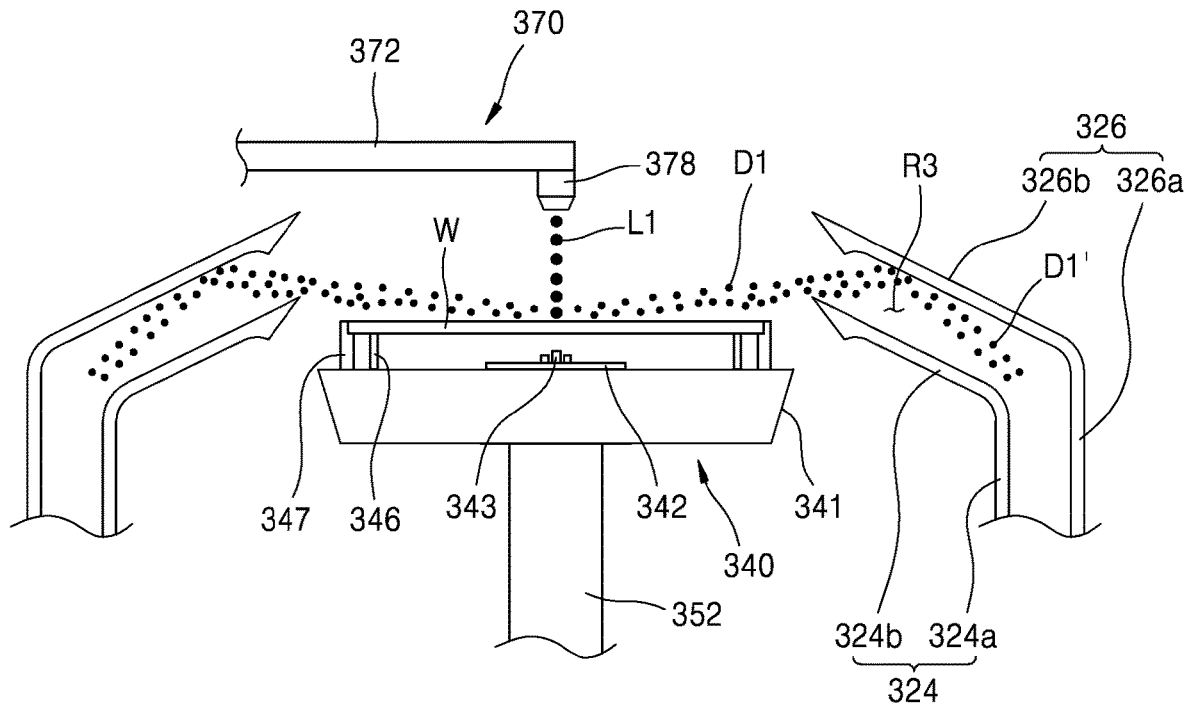
FIG. 7 is a schematic view showing that a treatment liquid is discharged to a frontside of a wafer, according to an embodiment of the present disclosure.

FIG. 7 is a schematic view showing that a treatment liquid L1 is discharged to a frontside of the wafer W, according to an embodiment of the present disclosure.

Referring to FIG. 7, the nozzle 378 is positioned vertically above the wafer W to discharge the treatment liquid L1. The discharged treatment liquid L1 collides with the frontside of the wafer W and then is scattered into droplets D1. The scattered droplets D1 are introduced into the inflow space R3 of the treatment chamber 320 (D1→D1') and collected. When the frontside of the wafer W is cleaned, the controller 390 may control the lifts 330 to adjust heights of the collection barrels 324 and 326, and control the inflow space R3 to correspond to a height of the wafer W.

Figure 8:
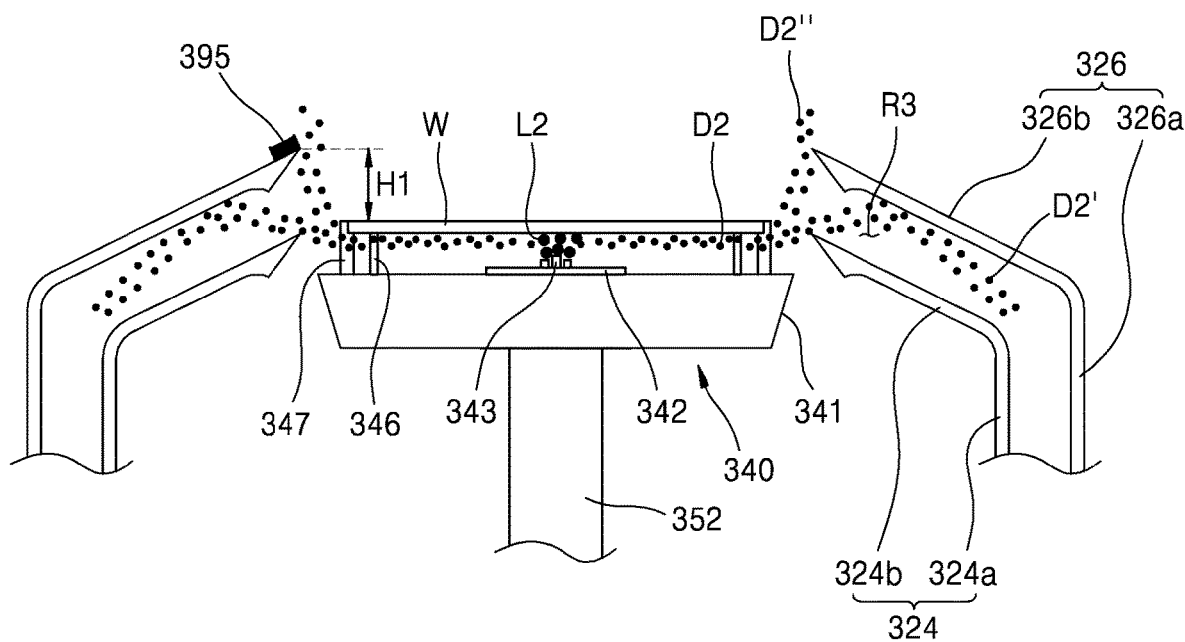
FIG. 8 is a schematic view showing a problem in a case when a treatment liquid is discharged to a backside of a wafer.

FIG. 8 is a schematic view showing a problem in a case when a treatment liquid L2 is discharged to a backside of the wafer W.

Referring to FIG. 8, the treatment liquid L2 may be discharged from the liquid discharger 343 spaced apart from the backside of the wafer W. The discharged treatment liquid L2 collides with the backside of the wafer W and then is bounced and scattered into droplets D2. The scattered droplets D2 are introduced into the inflow space R3 of the treatment chamber 320 (D2→D2') and collected. When the backside of the wafer W is cleaned, the controller 390 may control the lifts 330 to adjust heights of the collection barrels 324 and 326, and control the inflow space R3 to correspond to a height of the wafer W.

However, unlike the cleaning process of the frontside of the wafer W, when the backside is cleaned, more droplets D2" may be scattered in the third direction 16 (i.e., a vertical direction). It may be regarded that this result occurs because the scattered droplets D2 moving outward from the center of the backside of the wafer W are scattered in a vertical direction due to an ascending air current formed by the rotating wafer W, or because the droplets D2 collide in a relatively narrow space between the backside of the wafer W and the liquid discharger 343 to form the fine scattered droplets D2".

According to an embodiment, a scattering rate was tested based on a flow rate condition for a frontside/backside. Water sensitive paper was attached to an end of the upper wall 326b to position a lower end of the water sensitive paper 6 mm higher than a height of a horizontal plane of the wafer W. The wafer W was rotated at 1000 rpm, and DI water was supplied to the frontside/backside for 10 seconds. A flow rate for the frontside was fixed at 800 sccm (standard cubic centimeter per minute). The number of droplets colliding with the water sensitive paper was measured.

TABLE 1

| Flow Rate for Frontside (sccm) | 800 | 800 | 800 | 800 | 800 |
|---|---|---|---|---|---|
| Flow Rate for Backside (sccm) | 800 | 600 | 400 | 200 | 0 |
| Number of Droplets on Water Sensitive Paper | 165 | 68 | 78 | 81 | 65 |

Referring to Table 1, it is shown that, when the flow rate for the backside of the wafer W is increased, the number of droplets scattered in a vertical direction is also increased. Eventually, in a process of supplying a treatment liquid to the backside of the wafer W, a probability that the inside of the wafer treatment apparatus 300 is contaminated by the droplets D2" not collected into the treatment chamber 320 but scattered in a vertical direction is increased.

Figure 9:
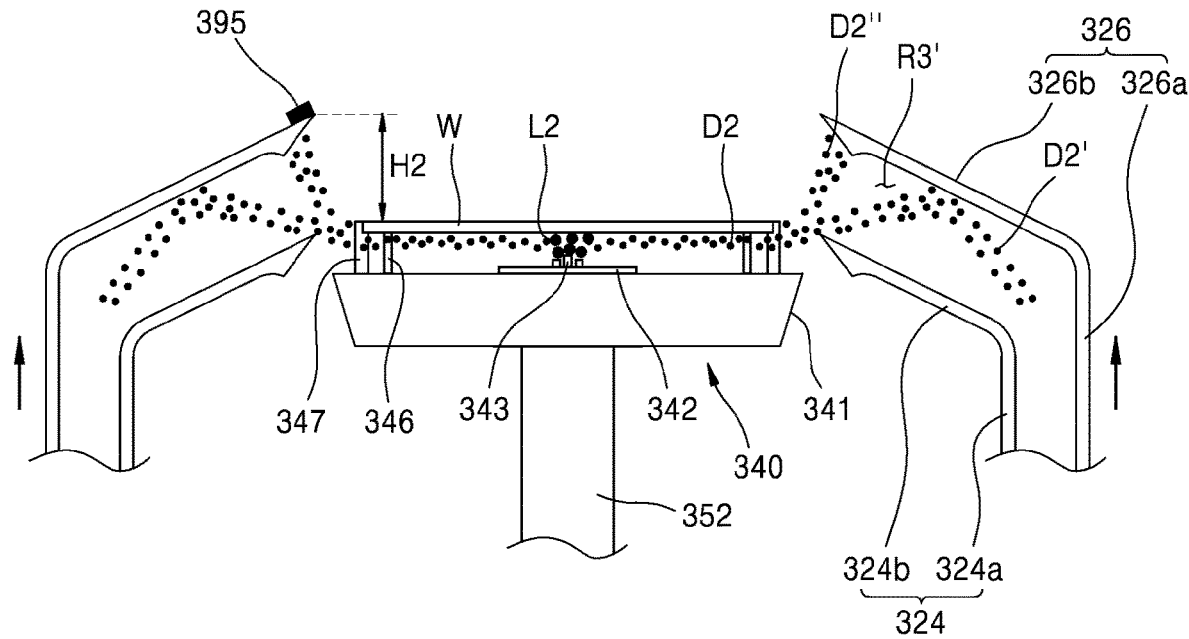
FIG. 9 is a schematic view showing that a treatment liquid is discharged to a backside of a wafer, according to an embodiment of the present disclosure.

FIG. 9 is a schematic view showing that the treatment liquid L2 is discharged to a backside of the wafer W, according to an embodiment of the present disclosure. Although FIG. 9 shows that the treatment liquid L2 is discharged only to the backside of the wafer W, the present disclosure is equally applicable to a process of discharging the treatment liquid L1 to a frontside of the wafer W while the treatment liquid L2 is being discharged to the backside.

The present disclosure is characterized in that, in a process of discharging the treatment liquid L2 to the backside of the wafer W, the controller 390 controls a height from the wafer W to an upper end of the inflow space R1, R2, or R3 to be higher compared to a process of discharging the treatment liquid L1 to the frontside of the wafer W. A size of the inflow space R1, R2, or R3 in the process of discharging the treatment liquid L1 to the frontside of the wafer W may be preset or be adjusted based on a process. The controller 390 may control the height from the wafer W to the upper end of the inflow space R1, R2, or R3 in the backside process of the wafer W to be higher compared to the inflow space R1, R2, or R3 in the frontside process of the wafer W, which is preset or adjusted based on a process. In order to collect the droplets D2" not introduced into the treatment chamber 320 but scattered in the third direction 16, the controller 390 may give control to raise the upper end of the inflow space R1, R2, or R3 rather than to lower a lower end of the inflow space R1, R2, or R3. The concept of controlling the height from the wafer W to the upper end of the inflow space R1, R2, or R3 to be higher may also include controlling the height to the upper end of the inflow space R1, R2, or R3 to be relatively higher by lowering the wafer W.

Referring to FIG. 9, the controller 390 determines a process type. Initially, the controller 390 determines whether a treatment liquid is discharged, and controls of a height of at least one of the collection barrels 322, 324, and 326 in such a manner that one of the inflow spaces R1, R2, and R3 corresponds to a height of a horizontal plane of the wafer W, based on a type of the treatment liquid.

Then, the controller 390 determines whether the treatment liquid is discharged to the frontside, to the backside, or to the frontside and backside of the wafer W. When a process of discharging the treatment liquid to at least the backside of the wafer W is included, the controller 390 controls the height from the wafer W to the upper end of the inflow space R1, R2, or R3 to be higher compared to a process of discharging the treatment liquid only to the frontside of the wafer W.

According to an embodiment, a height of an upper end of the inflow space R3 provided between the second and third collection barrels 324 and 326 may be increased (H1→H2) to ensure a larger inflow space R3'. The controller 390 may control the third lift 336 in such a manner that the driving shaft 337a of the third driving unit 337 increases a height of the third collection barrel 326. A probability that the droplets D2" scattered in a vertical direction are collected into the inflow space R3' is increased by the inflow space R3' having the increased height (H1→H2). Therefore, the number of droplets scattered out of the treatment chamber 320 may be reduced, and a probability of contamination of the wafer treatment apparatus 300 may also be reduced.

Figure 10:
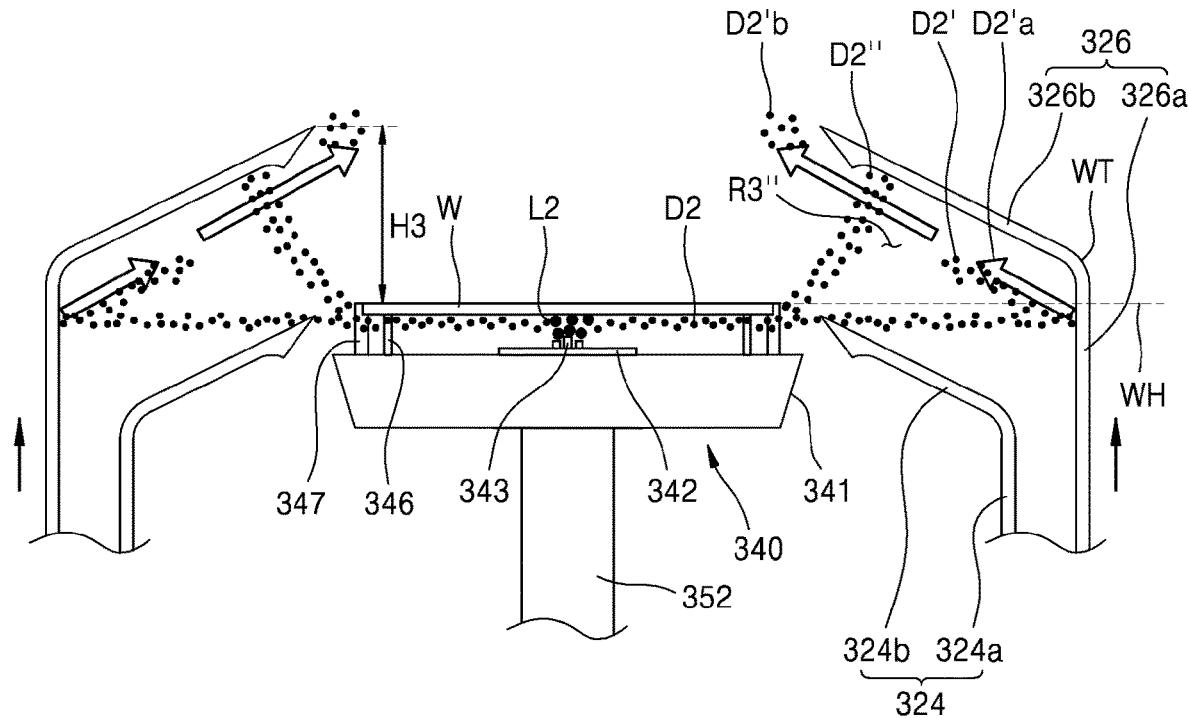
FIG. 10 is a schematic view showing a treatment liquid discharge state for controlling a maximum lifting height of a treatment chamber, according to an embodiment of the present disclosure.

FIG. 10 is a schematic view showing a treatment liquid discharge state for controlling a maximum lifting height of the treatment chamber 320, according to an embodiment of the present disclosure. Like the embodiment of FIG. 9, the embodiment of FIG. 10 is described on the basis of a height of the third collection barrel 326.

When a height of an upper end of the inflow space R3' is increased, the scattered droplets D2" may be collected effectively. However, the height of the third collection barrel 326 may not be increased without limitation. FIG. 10 shows that the height of the third collection barrel 326 is further increased to further increase a height of the inflow space R3" (H2→H3) compared to FIG. 9. In this case, a probability that the droplets D2" scattered in a vertical direction are collected into the inflow space R3" may be increased. However, when the third collection barrel 326 is raised excessively, the number of droplets D2 reaching the side wall 326a rather than the diagonal upper wall 326b of the third collection barrel 326 is increased. This is because the side wall 326a is increased to correspond to a height WH of a horizontal plane of the wafer W as the result of further raising the third collection barrel 326. The droplets D2' stably introduced into the inflow space R3" and the droplets D2" reaching the upper wall 326b may flow down along the diagonal upper wall 326b and be collected. On the contrary, the droplets D2'a moving to the side wall 326a and colliding with and bounced on the side wall 326a may be scattered upward again (D2'b) to escape from the inflow space R3" (see arrow directions). That is, the droplets D2 are bounced and scattered from a larger area of the vertical side wall 326a (D2'a→D2'b) and thus more droplets escape from the inflow space R3".

Therefore, the controller 390 may limit a maximum lifting height of the inflow space R3'. The controller 390 may control the maximum lifting height to an extend that the height WH (see FIG. 10) of the horizontal plane of the wafer W corresponds to at least the upper wall 326b of the third collection barrel 326. In other words, the lifting height may be controlled in such a manner that the height WH of the horizontal plane of the wafer W corresponds to the upper wall 326b of the third collection barrel 326 provided at a higher position from among two, e.g., second and third, collection barrels 324 and 326 forming the inflow space R3' within a range of the inflow space R3'. In another point of view, the controller 390 may control the maximum lifting height in such a manner that the height WH of the horizontal plane of the wafer W is not lower than at least an upper end WT of the side wall 326a of the third collection barrel 326. For example, in the wafer treatment apparatus 300 using a 300 mm wafer as the wafer W to perform a process under the above-described condition of Table 1, considering that a height of the upper wall 326b is set to be about 20 mm, a maximum lifting height of the collection barrel 326 may be set within a range less than or equal to 40 mm (and greater than 0 mm).

According to an embodiment of the present disclosure, the controller 390 may control a height from the wafer W to an upper end of the inflow space R3 in consideration of a rotation speed of the wafer supporter 340, a discharge amount or discharge speed of a treatment liquid from the liquid discharger 343 or 370, or the like. For example, when the rotation speed of the wafer supporter 340 is increased, or when the discharge amount or discharge speed of the treatment liquid is increased, the height from the wafer W to the upper end of the inflow space R3 may be controlled to be higher.

According to an embodiment of the present disclosure, the controller 390 may determine properties of a surface of the wafer W. The surface of the wafer W may be hydrophilic or hydrophobic. The properties of the surface of the wafer W may be pre-determined based on a wafer treatment process, and referred to by the controller 390. For example, when the treatment liquid is DI water and when the surface of the wafer W is hydrophilic, scattering of droplets due to collision of the treatment liquid may not be significant. On the contrary, when the treatment liquid is DI water and when the surface of the wafer W is hydrophobic, scattering of droplets due to collision of the treatment liquid may be significant. When the scattering of droplets is increased, the height from the wafer W to the upper end of the inflow space R3' may be controlled to be higher. As such, when the surface of the wafer W is hydrophobic, the controller 390 may control the height from the wafer W to the upper end of the inflow space R3' to be higher compared to a case when the surface of the wafer W is hydrophilic.

According to an embodiment of the present disclosure, the controller 390 may control a height of the wafer supporter 340 in a process of discharging a treatment liquid to a backside of the wafer W. Compared to a process of discharging a treatment liquid to a frontside of the wafer W, the controller 390 may control the height of the wafer supporter 340 to be lower in the process of discharging the treatment liquid to the backside of the wafer W. A height of the inflow space R3 may be constantly maintained. When the height of the wafer supporter 340 is reduced, a height from the wafer W to an upper end of the inflow space R3 is relatively increased, and thus a probability of collecting the droplets D2" scattered in a vertical direction is also increased. In addition, when the height of the wafer supporter 340 is controlled to be lower, the third collection barrel 326 may also be raised as shown in FIG. 9 to control a height of an upper end of the inflow space R3' to be higher. Alternatively, when the height of the wafer supporter 340 is controlled to be lower, the second collection barrel 324 may also be lowered to control a total height of the inflow space R3' to be higher.

According to an embodiment of the present disclosure, as shown in FIGS. 8 and 9, a scattering sensor 395 may be further mounted on the treatment chamber 320. The scattering sensor 395 may be mounted at an upper portion of the treatment chamber 320 to sense or collect scattered droplets escaping from the treatment chamber 320. The scattering sensor 395 may sense an amount of the scattered droplets. The scattering sensor 395 may directly sense the amount of droplets attached to the surface thereof, or sense the amount, number, or the like of droplets attached to the surface thereof, by using a measuring tool (not shown) such as a camera. The controller 390 may control a height of an upper end of the inflow space R3 based on a scattering data signal received from the scattering sensor 395 during a process. In an embodiment, the scattering senor 395 may include a camera that generates an image of the scattered droplets attached to the surface of the scattering sensor 395. The controller 390 may receive the image from the camera, and may perform an image analysis on the image to count a number of objects, corresponding to the droplets, from the image. Based on the number of the droplets, the controller may control a height of an upper end of the inflow space.

Figure 11:
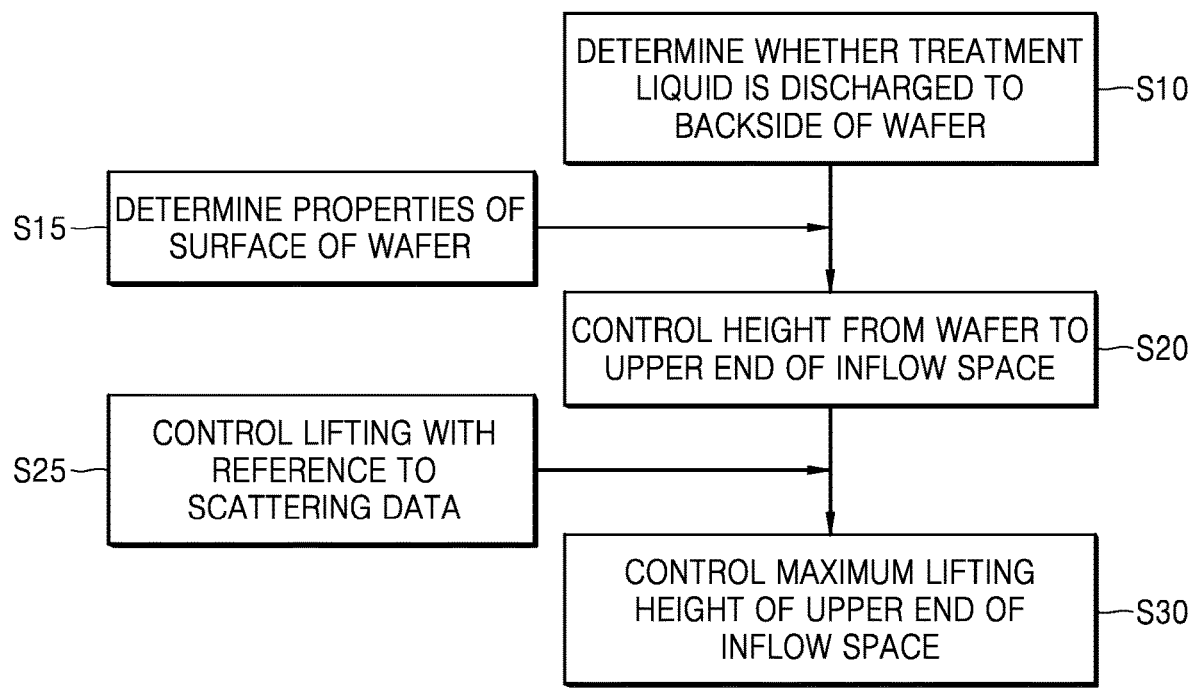
FIG. 11 is a schematic view showing controls by a controller to reduce scattering of a treatment liquid in a wafer treatment process, according to an embodiment of the present disclosure.

FIG. 11 is a schematic view showing controls by the controller 390 to reduce scattering of a treatment liquid in a wafer treatment process, according to an embodiment of the present disclosure.

Initially, the controller 390 determines whether a treatment liquid is discharged to a backside of the wafer W (S10). The controller 390 determines whether the treatment liquid is discharged (1) to a frontside, (2) to a backside, or (3) to the frontside and backside of the wafer W. The process of discharging the treatment liquid to the backside of the wafer W includes the processes (2) and (3).

Then, when it is determined that the treatment liquid is discharged to at least the backside of the wafer W, the controller 390 controls a height from the wafer W to an upper end of the inflow space R1, R2, or R3 to be higher (S20). The controller 390 controls a height of the collection barrel 322, 324, or 326 of the treatment chamber 320 to control the height from the wafer W to the upper end of the inflow space R1, R2, or R3 to be higher.

Optionally, the controller 390 may determine properties of a surface of the wafer W (S15). When the surface of the wafer W is hydrophilic, the height from the wafer W to the upper end of the inflow space R1, R2, or R3 may be controlled to be higher compared to a case when the surface of the wafer W is hydrophobic.

Then, the controller 390 controls a maximum lifting height of the upper end of the inflow space R1, R2, or R3 (S30). The controller 390 may control the maximum lifting height in such a manner that the height WH of the horizontal plane of the wafer W corresponds to the upper wall 324b or 326b of the collection barrel 324 or 326 provided at a higher position from among two collection barrels 322 and 324, or 324 and 326 forming the inflow space R1, R2, or R3 within a range of the inflow space R1, R2, or R3.

Optionally, the controller 390 may control lifting of the treatment chamber 320 with reference to scattering data (S25). The controller 390 may control the height and the maximum lifting height of the upper end of the inflow space R1, R2, or R3 based on the scattering data including the amount, number, or the like of scattered droplets, which is received from the scattering sensor 395.

As described above, according to an embodiment of the present disclosure, a wafer treatment apparatus and scattering reduction method capable of reducing scattering of wafer treatment liquids may be provided.

Furthermore, according to an embodiment of the present disclosure, internal contamination of the wafer treatment apparatus may be prevented and process errors may be reduced by reducing scattering of the wafer treatment liquids.

In addition, according to an embodiment of the present disclosure, an optimal process environment for reducing scattering may be provided in a process of cleaning a frontside/backside of a wafer.

However, the scope of the present disclosure is not limited to the above effects.

While the present disclosure has been particularly shown and described with reference to embodiments thereof, it will be understood by one of ordinary skill in the art that various changes in form and details may be made therein without departing from the scope of the present disclosure as defined by the following claims.

What is claimed is:

1. A wafer treatment apparatus comprising:
a wafer supporter for supporting and rotating a wafer;
a frontside liquid discharger for discharging a first liquid toward a frontside of the wafer;
a backside liquid discharger for discharging a second liquid toward a backside of the wafer;
a treatment chamber for accommodating the wafer supporter, and including a plurality of liquid collecting inlets stacked on each other in a vertical direction and receiving at least one of the first liquid discharged from the frontside liquid discharger and the second liquid discharged from the backside liquid discharger;
a controller for controlling a height, relative to the frontside of the wafer, of an upper end of a first liquid collecting inlet of the plurality of liquid collecting inlets to have one of a first height in a process of discharging the second liquid to the backside of the wafer adjacent to the wafer supporter and a second height, lower than the first height, in a process of discharging the first liquid to the frontside of the wafer; and
a scattering sensor positioned at an upper portion of the treatment chamber and configured to collect at least one of the first liquid and the second liquid that is scattered,
wherein the controller controls the height of the upper end of the first liquid collecting inlet relative to the frontside of the wafer based on a number of droplets attached to the scattering sensor.

2. The wafer treatment apparatus of claim 1,
wherein the controller determines whether the first liquid is discharged to the frontside of the wafer, whether the second liquid is discharged to the backside of the wafer, whether the first liquid and the second liquid are discharged to the frontside and the backside of the wafer, respectively, and controls the height from the wafer to the upper end of the first liquid collecting inlet to be higher in a process of discharging the second liquid to at least the backside of the wafer, compared to a process of discharging the first liquid only to the frontside of the wafer.

3. The wafer treatment apparatus of claim 1,
wherein the wafer supporter comprises:
a rotating support plate; and
a fixed support plate covering a central region of the rotating support plate and exposing an outer region of the rotating support plate, and
wherein the backside liquid discharger is mounted on the fixed support plate.

4. The wafer treatment apparatus of claim 3, further comprising:
a plurality of support pins mounted on the outer region of the rotating support plate and supporting at least parts of the backside of the wafer; and
a plurality of chuck pins mounted on the outer region of the rotating support plate and supporting at least parts of an edge of the wafer,
wherein a space is formed between the wafer and the rotating support plate.

5. The wafer treatment apparatus of claim 1, further comprising:
a plurality of drivers connected to the treatment chamber,
wherein the treatment chamber comprises a plurality of collection barrels stacked on each other,
wherein each driver of the plurality of drivers is connected to a corresponding collection barrel of the plurality of collection barrels, and
wherein the first liquid collecting inlet corresponds to a space between neighboring two collection barrels of the plurality of collection barrels.

6. The wafer treatment apparatus of claim 5,
wherein the controller controls a first driver, among the plurality of drivers, connected to a first collection barrel of the neighboring two collection barrels, to adjust a height of the first collection barrel relative to the frontside of the wafer such that the first liquid collecting inlet is horizontally adjacent to an edge of the wafer supporter.

7. The wafer treatment apparatus of claim 5,
wherein each collection barrel of the plurality of collection barrels comprises a side wall and an upper wall extending inward and diagonally upward from an upper end of the side wall.

8. The wafer treatment apparatus of claim 7,
wherein the controller controls a height of a collection barrel provided at a higher position from among two collection barrels forming an inflow space, in such a manner that a height of a horizontal plane of the wafer supported by the wafer supporter corresponds to an upper wall of the collection barrel within a range of the inflow space.

9. The wafer treatment apparatus of claim 8,
wherein the controller controls a maximum lifting height in such a manner that the height of the horizontal plane of the wafer supported by the wafer supporter is not lower than an upper end of a side wall of the collection barrel provided at a higher position from among the two collection barrels forming the inflow space.

10. The wafer treatment apparatus of claim 6, further comprising:
a plurality of lift bars, each lift bar of the plurality of lift bars connecting a corresponding driver of the plurality of drivers to a corresponding collection barrel of the plurality of collection barrels.

11. The wafer treatment apparatus of claim 10,
wherein the controller controls each driver of the plurality of drivers and independently adjusts a height of the corresponding collection barrel of the plurality of collection barrels connected to each driver of the plurality of drivers, and
wherein a size, in the vertical direction, of the first liquid collecting inlet, is increased by raising the height of the first collection barrel relative to a height of the other of the neighboring two collection barrels of the plurality of collection barrels.

12. The wafer treatment apparatus of claim 10,
wherein a first driver of the plurality of drivers is connected to a corresponding collection barrel having two sub-collection barrels connected with each other, and
wherein a first lift bar, among the plurality of lift bars, connects the first driver to the two sub-collection barrels.

13. The wafer treatment apparatus of claim 1,
wherein the controller further controls the first height of the upper end of the first liquid to be higher for the wafer having a hydrophobic surface compared to for the wafer having a hydrophilic surface.

14. The wafer treatment apparatus of claim 1, further comprising:

a support driver for lifting the wafer supporter, wherein the controller controls the height of the upper end of the first liquid collecting inlet relative to the frontside of the wafer by lifting the wafer in the vertical direction.

15. The wafer treatment apparatus of claim 1, wherein the controller further controls the height of the upper end of the first liquid collecting inlet based on at least one of a rotation speed of the wafer supporter, a discharge amount of the first liquid from the frontside liquid discharger, a discharge amount of the second liquid from the backside liquid discharger, a discharge speed of the first liquid from the frontside liquid discharger, and a discharge speed of the second liquid from the backside liquid discharger.

16. A method for reducing scattering of a treatment liquid in a wafer treatment apparatus comprising a wafer supporter for supporting and rotating a wafer, a front liquid discharger for discharging a first liquid toward a frontside of the wafer, a backside liquid discharger for discharging a second liquid toward a backside of the wafer, and a treatment chamber for providing at least one inflow space surrounding the wafer supporter and formed in a vertical direction to receive the first liquid and the second liquid, the method comprising controlling a height from the wafer to an upper end of an inflow space to be higher in a process of discharging the second liquid to the backside of the wafer, compared to a process of discharging the first liquid to the frontside of the wafer, wherein, before the process of discharging the second liquid to the backside of the wafer, properties of a surface of the wafer are determined and the height from the wafer to the upper end of the inflow space is controlled to be higher in a case when the surface of the wafer is hydrophobic, compared to a case when the surface of the wafer is hydrophilic.

17. The method of claim 16, wherein a lifting height of the treatment chamber is controlled in such a manner that a height of a horizontal plane of the wafer supported by the wafer supporter is not lower than an upper end of a side wall of the treatment chamber forming the inflow space.

18. A wafer treatment apparatus for reducing scattering of a liquid in a process of discharging the liquid to a backside of a wafer, the wafer treatment apparatus comprising:

a wafer supporter for supporting and rotating the wafer;

a liquid discharger for discharging a first liquid and a second liquid for treatment to a frontside and a backside of the wafer, respectively;

a treatment chamber for providing at least one inflow space surrounding the wafer supporter and formed in a vertical direction to receive the first liquid and the second liquid;

a controller for controlling a height from the wafer to an upper end of an inflow space to be higher in a process of discharging the second liquid to the backside of the wafer facing the wafer supporter, compared to a process of discharging the first liquid to the frontside of the wafer; and a scattering sensor positioned at an upper portion of the treatment chamber and configured to collect at least one of the first liquid and the second liquid that is scattered, wherein the treatment chamber comprises a plurality of collection barrels stacked on each other, wherein each collection barrel of the plurality of collection barrels comprises a side wall and an upper wall extending inward and diagonally upward from an upper end of the side wall, wherein the controller controls a maximum lifting height in such a manner that a height of a horizontal plane of the wafer supported by the wafer supporter is not lower than an upper end of a side wall of a collection barrel provided at a higher position from among two collection barrels forming the inflow space, and wherein the controller controls the height of the upper end of the collection barrel relative to the frontside of the wafer based on a number of droplets attached to the scattering sensor.

19. The wafer treatment apparatus of claim 1, wherein the first liquid includes isopropyl alcohol (IPA) and the second liquid includes deionized (DI) water.

* * * * *